(12) United States Patent
Gredone et al.

(10) Patent No.: US 7,475,273 B2
(45) Date of Patent: *Jan. 6, 2009

(54) HYBRID PARALLEL/SERIAL BUS INTERFACE

(75) Inventors: Joseph Gredone, Chalfont, PA (US); Alfred Stufflet, Plymouth Meeting, PA (US); Timothy A. Axness, Collegeville, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/648,938

(22) Filed: Jan. 3, 2007

(65) Prior Publication Data

US 2007/0113117 A1 May 17, 2007

Related U.S. Application Data

(63) Continuation of application No. 11/151,006, filed on Jun. 13, 2005, which is a continuation of application No. 11/001,958, filed on Dec. 2, 2004, now Pat. No. 7,107,479, which is a continuation of application No. 10/081,466, filed on Feb. 22, 2002, now Pat. No. 6,829,718, which is a continuation of application No. 10/080,899, filed on Feb. 22, 2002, now Pat. No. 6,823,469, which is a continuation of application No. 10/080,817, filed on Feb. 22, 2002, now Pat. No. 6,848,018, which is a continuation of application No. 09/990,060, filed on Nov. 21, 2001, now Pat. No. 7,069,464.

(51) Int. Cl.
*G06F 1/04* (2006.01)
*G01S 15/00* (2006.01)

(52) U.S. Cl. ............. 713/600; 713/600; 330/254; 330/278; 342/19; 342/92; 342/392; 367/65; 367/98; 381/321

(58) Field of Classification Search ............. 713/600; 367/65, 98
See application file for complete search history.

(56) References Cited

U.S. PATENT DOCUMENTS 4,675,861 A 6/1987 Uttermark (Continued)

FOREIGN PATENT DOCUMENTS

JP 05-006335 1/1993

(Continued)

OTHER PUBLICATIONS von Herzen et al., "Multi-Chanel 622 Mb/s LVDS Data Transfer for Virtex-E Devices", Xilinx Inc., Jan. 6, 2001, http://direct.xilinx.com/bvdocs/appnotes/xapp233.pdf.

(Continued)

*Primary Examiner*—Nitin C. Patel
(74) *Attorney, Agent, or Firm*—Volpe and Koenig, P.C.

(57) ABSTRACT

A hybrid serial/parallel bus interface has a data block demultiplexing device. The data block demultiplexing device has an input configured to receive a data block and demultiplexes the data block into a plurality of nibbles. For each nibble, a parallel to serial converter converts the nibble into serial data. A line transfers each nibble's serial data. A serial to parallel converter converts each nibble's serial data to recover that nibble. A data block reconstruction device combines the recovered nibbles into the data block. The data block is employed by a gain controller.

23 Claims, 8 Drawing Sheets

U.S. PATENT DOCUMENTS

| | | |
|---|---|---|
| 5,018,142 A | 5/1991 | Simcoe et al. |
| 5,136,587 A | 8/1992 | Obana et al. |
| 5,327,126 A | 7/1994 | Beanland |
| 5,347,268 A | 9/1994 | Nelson et al. |
| 5,400,369 A | 3/1995 | Ikemura |
| 5,420,583 A | 5/1995 | Knecht et al. |
| 5,526,360 A | 6/1996 | Kraft |
| 5,541,596 A | 7/1996 | Yoshida |
| 5,544,319 A | 8/1996 | Acton et al. |
| 5,570,089 A | 10/1996 | Haas |
| 5,592,487 A | 1/1997 | Knecht et al. |
| 5,602,780 A | 2/1997 | Diem et al. |
| 5,635,933 A | 6/1997 | Fitzpatrick et al. |
| 5,784,003 A | 7/1998 | Dahlgren |
| 5,847,578 A | 12/1998 | Noakes et al. |
| 5,926,120 A | 7/1999 | Swenson et al. |
| 5,963,638 A | 10/1999 | Sheets |
| 6,040,792 A | 3/2000 | Watson et al. |
| 6,058,427 A | 5/2000 | Viswanath et al. |
| 6,122,683 A | 9/2000 | Ku et al. |
| 6,128,244 A | 10/2000 | Thompson et al. |
| 6,134,247 A | 10/2000 | Solana de Quesada et al. |
| 6,285,960 B1 | 9/2001 | Fung et al. |
| 6,356,369 B1 | 3/2002 | Farhan |
| 6,356,374 B1 | 3/2002 | Farhan |
| 6,477,250 B1 | 11/2002 | Sheets |
| 6,611,217 B2 | 8/2003 | Buchanan et al. |
| 6,729,003 B2 | 5/2004 | Poturi et al. |
| 6,792,003 B1 | 9/2004 | Potluri et al. |
| 6,823,468 B2 | 11/2004 | Gredone et al. |
| 6,823,469 B2 | 11/2004 | Gredone et al. |
| 6,829,718 B2 | 12/2004 | Gredone et al. |
| 6,848,018 B2 | 1/2005 | Gredone et al. |
| 6,961,347 B1 | 11/2005 | Bunton et al. |

FOREIGN PATENT DOCUMENTS

| | | |
|---|---|---|
| JP | 05-250316 | 9/1993 |
| JP | 11-167548 | 6/1999 |
| JP | 11-187051 | 7/1999 |
| JP | 2000-200121 | 7/2000 |
| JP | 2000-224229 | 8/2000 |
| KR | 42847 | 4/1991 |
| KR | 1997-56528 | 7/1997 |
| TW | 432851 | 5/2001 |
| TW | 444448 | 7/2001 |
| TW | 451566 | 8/2001 |

OTHER PUBLICATIONS

Kitanovska et al., "Bus LVDS with Virtex-E Devices", Xilinx Inc., Jul. 26, 2000, http://direct.xilinx.com/bvdocs/appnotes/xapp243.pdf.

"DS90CR211/DS90CR212 21-Bit Channel Link"; National Semiconductor; Santa Clara, California; http://www.national.com/ds/DS/DS90CR211.pdf.

Logue, "Virtex SelectLink Communications Channel"; Xilinx, Inc.; San Jose, California; Mar. 15, 2000; http://www.xilinx.com/bvdocs/appnotes/xapp234.pdf.

"LVDS System Data Framing"; Xilinx, Inc.; San Jose, California; Dec. 18, 2000; http://direct.xilinx.com/bvdocs/appnotes/xapp238.pdf.

"21-Bit Channel Link", National Semiconductor, Jul. 1997, http://www.national.com/ds/DS/DS90CR21.pdf.

Novak et al., "Channel Link Moving and Shaping Information in Point-To-Point Application", National Semiconductor, May 1996, http://www.national.com/an/AN/AN-1041.pdf.

Goldie, "DS92LV010A Bus LVDS Transceiver Ushers in a New Era of High-Performance Backplane Design", National Semiconductor, http://www.national.com/an/AN/AN-1115.pdf, Jul. 1998.

Huq et al., "An Overview of LVDS Technology", National Semiconductor, http://www.national.com/an/AN/AN-971.pdf, Jul. 1998.

"3606—Digitally Controlled Programmable Gain Instrumentation Amplifier", Burr-Brown Corporation, http://focus.ti.com/lit/ds/symlink/3606.pdf, Oct. 1983.

"DS3886A-BTL 9-Bit Latching Data Transceiver [Obsolete]." http://www.national.com/pf/DS/DS3886A.html May 31, 2006.

"DS90CR213- 21-Bit Channel Link -66 MHz." http://www.national.com/pf/DS/DS90CR213.html May 31, 2006.

McGettigen, Ed. "Eight Channel, One Clock, One Frame LVDS Transmitter/Receiver." Xilinx, XAPP245 (v1.1), Mar. 15, 2001, pp. 1-20.

"DS90CR213- 21-Bit Channel Link -66 MHz." http://www.national.com/pf/DS/DS90CR213.html May 31, 2006.

Drigalsky, "Serielle Schnittstellentechnik un Protokollanalyzer-Anwendungen: serielle Schnittstellen und deren Protokolle verstehen, aufbauen und testen," 1991, IWT Verlang GMBH, Germany ISBN: 3-88322-315-8.[3]

"3603 - Digitally Controlled Programmable Gain Instrumentation Amplifier", Burr-Brown Corporation, http://focus.ti.com/lit/ds/symlink/3606.pdf.

"DS3886A-BTL 9-Bit Latching Data Transceiver [Absolete]." http://www.national.com/pf/DS/DS3886A.html May 31, 2006.

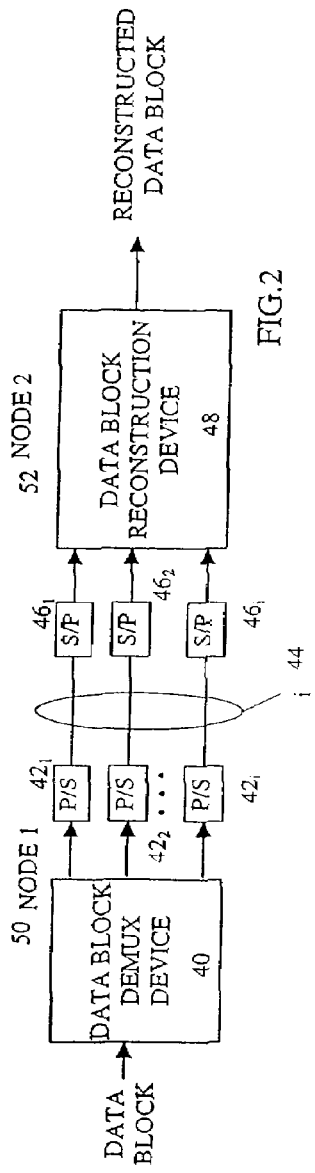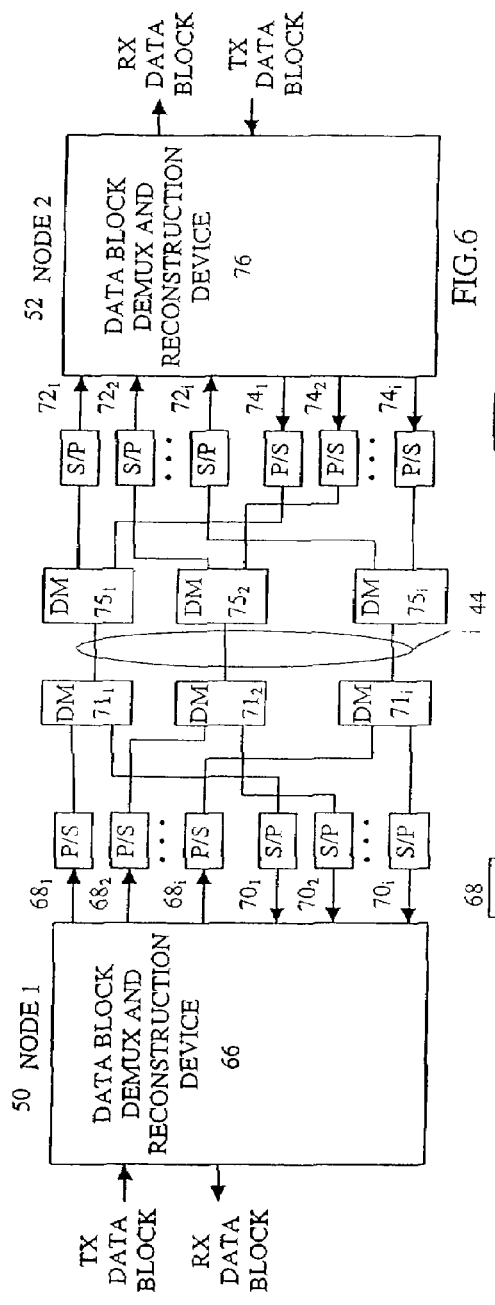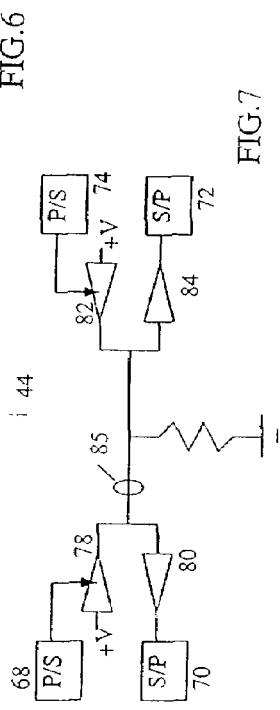

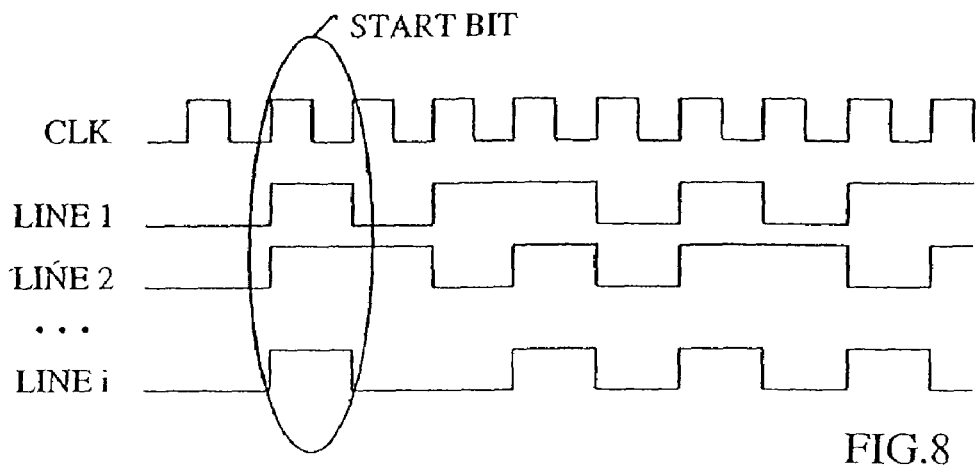
FIG.8
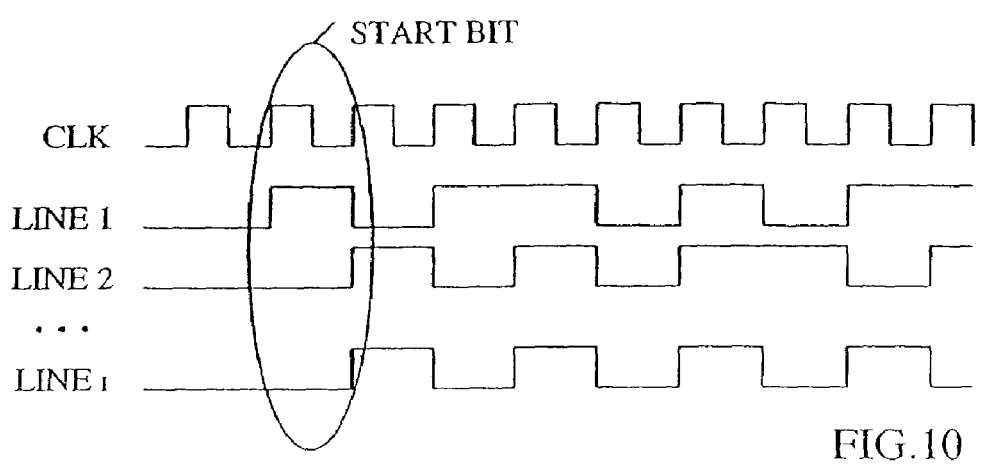
FIG.10
| FUNCTION | LINE 1 | LINE 2 |
|---|---|---|
| ABSOLUTE VALUE | 1 | 1 |
| RELATIVE INCREASE | 1 | 0 |
| RELATIVE DECREASE | 0 | 1 |
| NO DATA TRANSFERRED | 0 | 0 |
FIG.11
| FUNCTION | LINE 1 | LINE 2 |
|---|---|---|
| DEVICE 1 | 1 | 1 |
| DEVICE 2 | 1 | 0 |
| INVALID | 0 | 1 |
| NO DATA TRANSFERRED | 0 | 0 |
FIG.13

| FUNCTION/DEVICE | LINE 1 | LINE 2 | LINE 3 |
|---|---|---|---|
| ABSOLUTE VALUE/DEVICE 2 | 1 | 1 | 1 |
| ABSOLUTE VALUE/DEVICE 1 | 1 | 1 | 0 |
| RELATIVE INCREASE/DEVICE 2 | 1 | 0 | 1 |
| RELATIVE INCREASE/DEVICE 1 | 1 | 0 | 0 |
| RELATIVE DECREASE/DEVICE 2 | 0 | 1 | 1 |
| RELATIVE DECREASE/DEVICE 1 | 0 | 1 | 0 |
| INVALID | 0 | 0 | 1 |
| NO DATA TRANSFERRED | 0 | 0 | 0 |
FIG.14
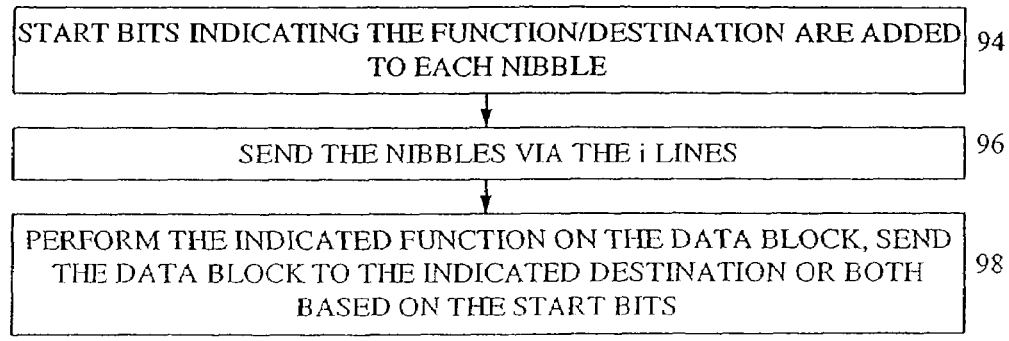
FIG.16
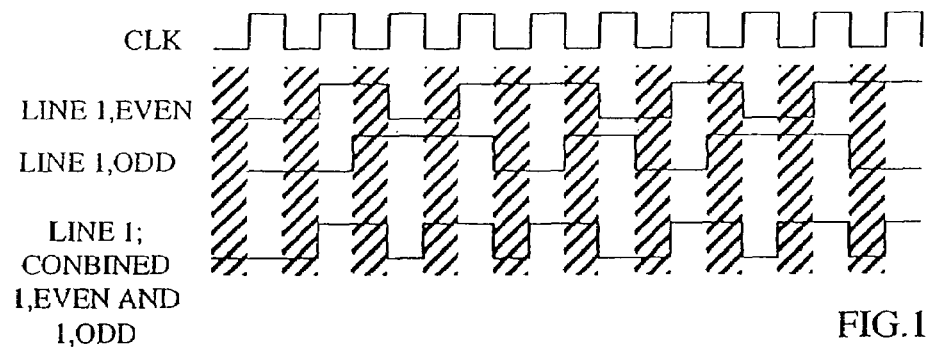
FIG.18

HYBRID PARALLEL/SERIAL BUS INTERFACE

CROSS REFERENCE TO RELATED APPLICATION(S)

This application is a divisional of U.S. patent application Ser. No. 11/151,006, filed Jun. 13, 2005 which is incorporated by reference as if fully set forth.

FIELD OF INVENTION

The present invention relates to data bus transfers. In particular, the invention relates to reducing the number of lines to transfer bus data for gain control.

BACKGROUND

The invention relates to bus data transfers. In particular, the invention relates to transfer of bus data for operating a gain controller (GC).

One example of a bus used to transfer data is shown in FIG. 1. FIG. 1 is an illustration of a receive and transmit gain controllers (GCs) 30, 32 and a GC controller 38 for use in a wireless communication system. A communication station, such as a base station or user equipment, transmits (TX) and receives (RX) signals. To control the gain of these signals, to be within the operating ranges of other reception/transmission components, the GCs 30, 32 adjust the gain on the RX and TX signals.

To control the gain parameters for the GCs 30, 32, a GC controller 38 is used. As shown in FIG. 1, the GC controller 38 uses a power control bus, such as a sixteen line bus 34, 36, to send a gain value for the TX 36 and RX 34 signals, such as eight lines for each. Although the power control bus lines 34, 36 allow for a fast data transfer, it requires either many pins on the GCs 30, 32 and the GC controller 38 or many connections between the GCs 30, 32 and GC controller 38 on an integrated circuit (IC), such as an application specific IC (ASIC). Increasing the number of pins requires additional circuit board space and connections. Increasing IC connections uses valuable IC space. The large number of pins or connections may increase the cost of a bus depending on the implementation.

Accordingly, it is desirable to have other data transfer approaches.

SUMMARY

A hybrid serial/parallel bus interface has a data block demultiplexing device. The data block demultiplexing device has an input configured to receive a data block and demultiplexes the data block into a plurality of nibbles. For each nibble, a parallel to serial converter converts the nibble into serial data. A line transfers each nibble's serial data. A serial to parallel converter converts each nibble's serial data to recover that nibble. A data block reconstruction device combines the recovered nibbles into the data block.

BRIEF DESCRIPTION OF THE DRAWING(S)

FIG. 2 is a block diagram of a hybrid parallel/serial bus interface.

FIG. 6 is a block diagram of a bi-directional hybrid parallel/serial bus interface.

FIG. 7 is a diagram of an implementation of one bi-directional line.

FIG. 8 is a timing diagram illustrating start bits.

FIG. 10 is a timing diagram of start bits for a function controllable hybrid parallel/serial bus interface.

FIG. 11 is a table of an implementation of start bits indicating functions.

FIG. 13 is a table of an implementation of start bits indicating destinations.

FIG. 14 is a table of an implementation of start bits indicating destinations/functions.

FIG. 16 is a flow chart for start bits indicating destinations/functions.

FIG. 18 is a timing diagram for a positive and negative clock edge hybrid parallel/serial bus interface.

DETAILED DESCRIPTION OF THE PREFERRED EMBODIMENTS

Figure 1:
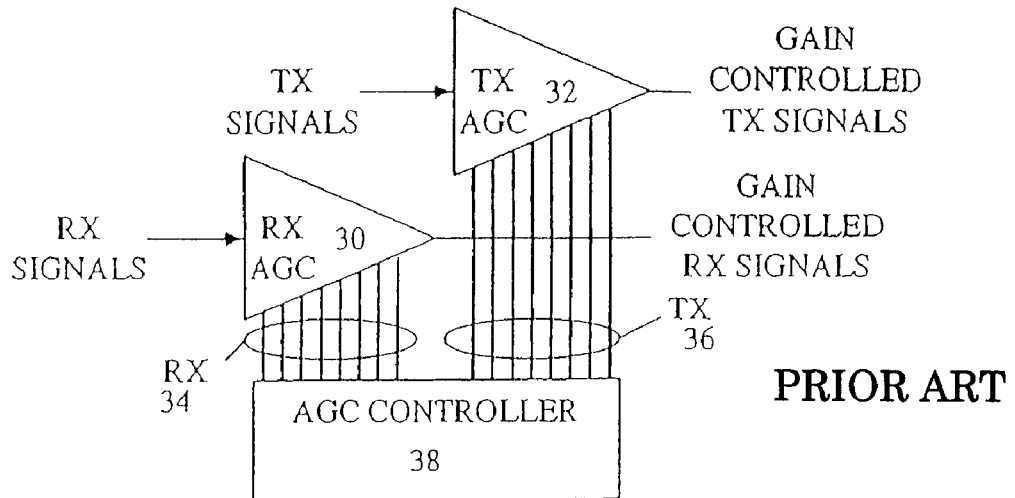
FIG. 1 is an illustration of a RX and TX GC and a GC controller.
Figure 3:
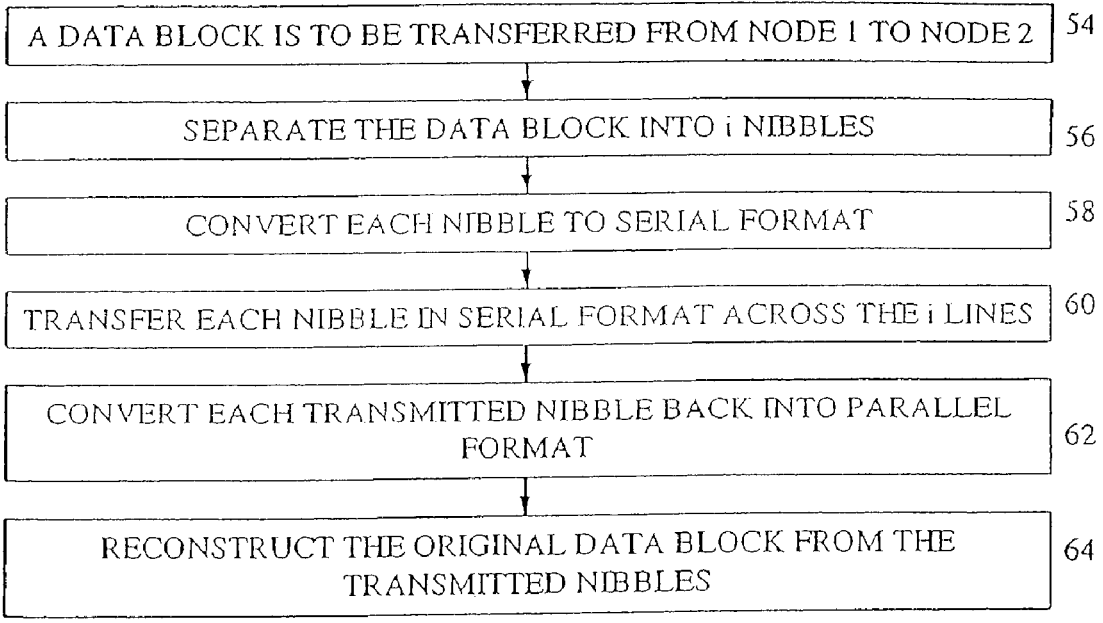
FIG. 3 is a flow chart for transferring data blocks using a hybrid parallel/serial bus interface.
Figure 4:
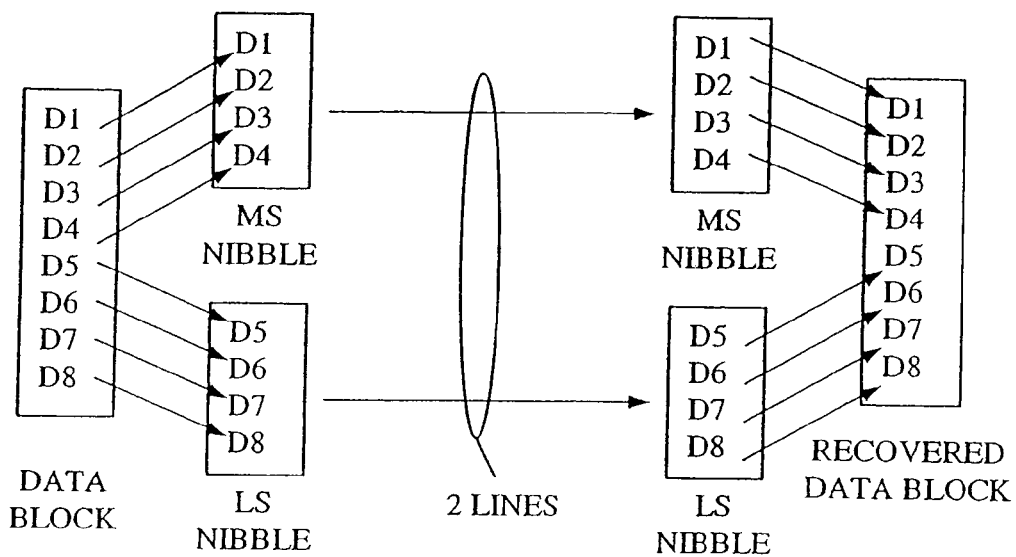
FIG. 4 illustrates demultiplexing a block into a most significant and least significant nibble.

FIG. 2 is a block diagram of a hybrid parallel/serial bus interface and FIG. 3 is a flow chart of hybrid parallel/serial bus interface data transfer. A data block is to be transferred across the interface from node 1 50 to node 2 52, (54). A data block demultiplexing device 40 receives the block and demultiplexes it into i nibbles for transfer over i data transfer lines 44, (56). The value for i is based on a tradeoff between number of connections and transfer speed. One approach to determine i is to first determine a maximum latency permitted to transfer the data block. Based on the allowed maximum latency, a minimum number of lines required to transfer the block is determined. Using the minimum number of lines, the lines used to transfer the data is selected to be at least the minimum. The lines 44 may be the pins and their associated connections on a circuit board or connections on an IC. One approach to demultiplex into nibbles divides the block into a most significant to a least significant nibble. To illustrate for an eight bit block transfer over two lines as shown in FIG. 4, the block is demultiplexed into a four bit most significant nibble and a four bit least significant nibble.

Figure 5:
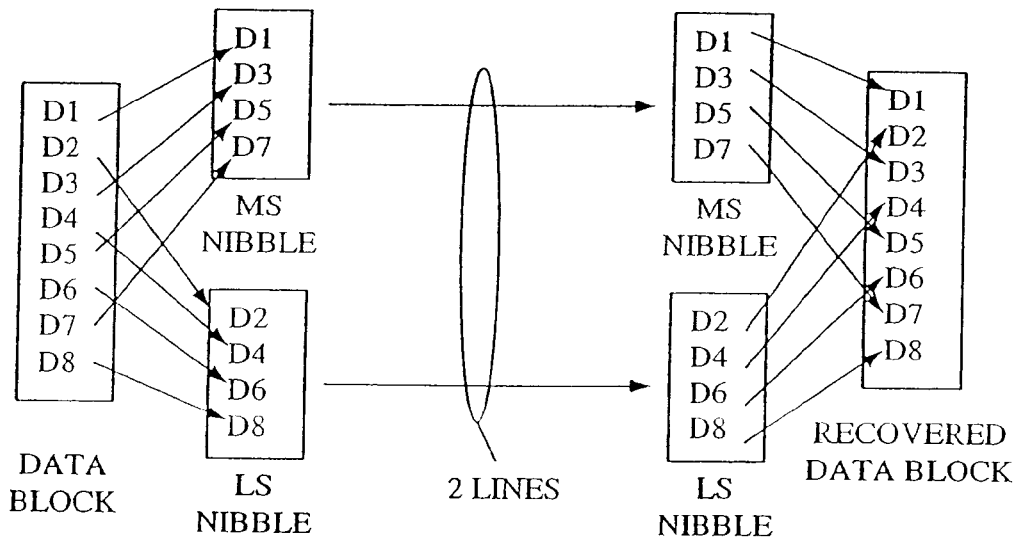
FIG. 5 illustrates demultiplexing a block using interleaving.

Another approach interleaves the block across the i nibbles. The first i bits of the block become the first bit in each nibble. The second i bits become the second bit in each nibble and so on until the last i bits. To illustrate for an eight bit block over two connections as shown in FIG. 5, the first bit is mapped to the first bit of nibble one. The second bit is mapped to the first bit of nibble two. The third bit is mapped to the second bit of nibble one and so on until the last bit is mapped to the last bit of nibble two.

Each nibble is sent to a corresponding one of i parallel to serial (P/S) converters 42, (58), converted from parallel bits to serial bits, and transferred serially across its line, (60). On the opposing end of each line is a serial to parallel (S/P) converter 46. Each S/P converter 46 converts the transmitted serial data into its original nibble, (62). The i recovered nibbles are processed by a data block reconstruction device 48 to reconstruct the original data block, (64).

In another, bidirectional, approach, the i connections are used to transfer data in both directions as shown in FIG. 6. Information data may be transferred in both directions or information may be sent in one direction and an acknowledgment sent back in the other direction. A data block for transfer from node 1 50 to node 2 52 is received by the data block demultiplexing and reconstruction device 66. The demultiplexing and reconstruction device 66 demultiplexes the block into i nibbles. i P/S converters 68 convert each nibble into serial data. A set of multiplexers (MUXs)/DEMUXs 71 couples each P/S converter 68 to a corresponding one of the i lines 44. At node 2 52, another set of MUXs/DEMUXs 75 connects the lines 44 to a set of S/P converters 72. The S/P converters 72 convert the received serial data of each nibble into the originally transmitted nibbles. The received nibbles are reconstructed by a data block demultiplexing and reconstruction device 76 into the original data block and output as the received data block.

For blocks transferred from Node 2 52 to Node 1 50, a data block is received by the data block demultiplexing and reconstruction device 76. That block is demultiplexed into nibbles and the nibbles are sent to a set of P/S converters 74. The P/S converters 74 convert each nibble into serial format for transfer across the i lines 44. A Node 2 set of MUXs/DEMUXs 75 couples the P/S converters 74 to the i lines 44 and a Node 1 set of MUXs/DEMUXs 71 couples the lines 44 to i S/P converters 70. The S/P converters 70 convert the transmitted data into its original nibbles. The data block demultiplexing and reconstruction device 66 reconstructs the data block from the received nibbles to output the received data block. Since data is only sent in one direction at a time, this implementation operates in a half duplex mode.

FIG. 7 is a simplified diagram of one implementation of bidirectional switching circuits. The serial output from the node 1 P/S converter 68 is input into a tri-statable buffer 78. The buffer 78 has another input coupled to a voltage representing a high state. The output of the buffer 78 is the serial data which is sent via the line 85 to a Node 2 tri-statable buffer 84. A resistor 86 is coupled between the line 85 and ground. The Node 2 buffer 84 passes the serial data to a Node 2 S/P converter 72. Similarly, the serial output from the Node 2 P/S converter 74 is input into a tri-statable buffer 72. That buffer 72 also having another input coupled to a high voltage. The serial output of that buffer 82 is sent via the line 85 to a Node 1 tri-statable buffer 80. The Node 1 buffer 80 passes the serial data to a Node 1 S/P converter 70.

In another implementation, some of the i lines 44 may transfer data in one direction and the other i lines 44 transfer data in another direction. At Node 1 50, a data block is received for transmission to Node 2 52. Based on the data throughput rate required for the block and the traffic demand in the opposite direction, j, being a value from 1 to i, of the connections are used to transfer the block. The block is broken into j nibbles and converted to j sets of serial data using j of the i P/S converters 68. A corresponding j Node 2 S/P converters 72 and the Node 2 data block separation and reconstruction device 76 recovers the data block. In the opposite direction, up to i-j or k lines are used to transfer block data.

In a preferred implementation of the bidirectional bus for use in a gain control bus, a gain control value is sent in one direction and an acknowledgment signal is sent back. Alternately, a gain control value is sent in one direction and a status of the gain control device in the other direction.

One implementation of the hybrid parallel/serial interface is in a synchronous system and is described in conjunction with FIG. 8. A synchronous clock is used to synchronize the timing of the various components. To indicate the start of the data block transfer, a start bit is sent. As shown in FIG. 8, each line is at its normal zero level. A start bit is sent indicating the beginning of the block transfer. In this example, all the lines send a start bit, although it is only necessary to send a start bit over one line. If a start bit, such as a one value, is sent over any line, the receiving node realizes that the block data transfer has begun. Each serial nibble is sent through its corresponding line. After transfer of the nibbles, the lines return to their normal state, such as all low.

Figure 9:
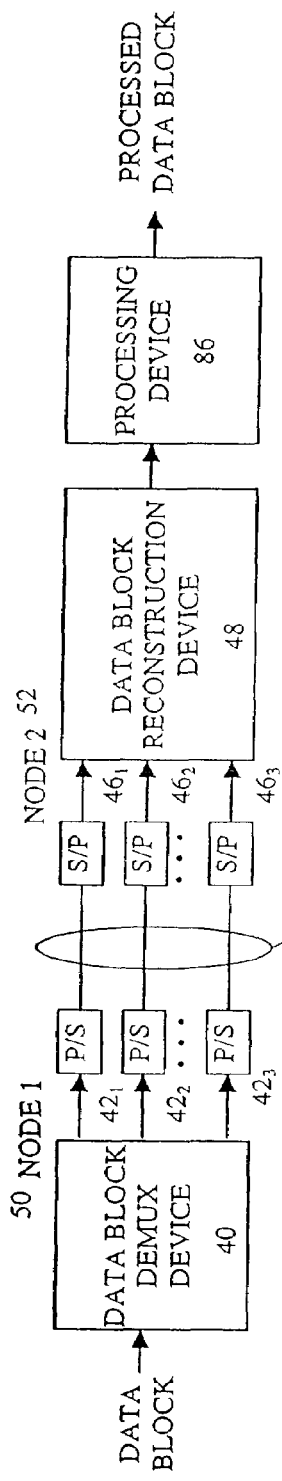
FIG. 9 is a block diagram of a function controllable hybrid parallel/serial bus interface.

In another implementation, the start bits are also used as an indicator of functions to be performed. An illustration of such an implementation is shown in FIG. 9. As shown in FIG. 10, if any of the connections's first bits are a one, the receiving node realizes block data is to be transferred. As shown in the table of FIG. 11 for a GC controller implementation, three combinations of start bits are used, "01," "10" and "11." "00" indicates a start bit was not sent. Each combination represents a function. In this illustration, "01" indicates that a relative decrease function should be performed, such as decreasing the data block value by 1. A "10" indicates that a relative increase function should be performed, such as increasing the data block value by 1. A "11" indicates an absolute value function, where the block maintains the same value. To increase the number of available functions, additional bits are used. For example, 2 starting bits per line are mapped to up to seven (7) functions or n starting bits for i lines are mapped up to $i^{n+1}-1$ functions. The processing device 86 performs the function on the received data block as indicated by the starting bits.

Figure 12:
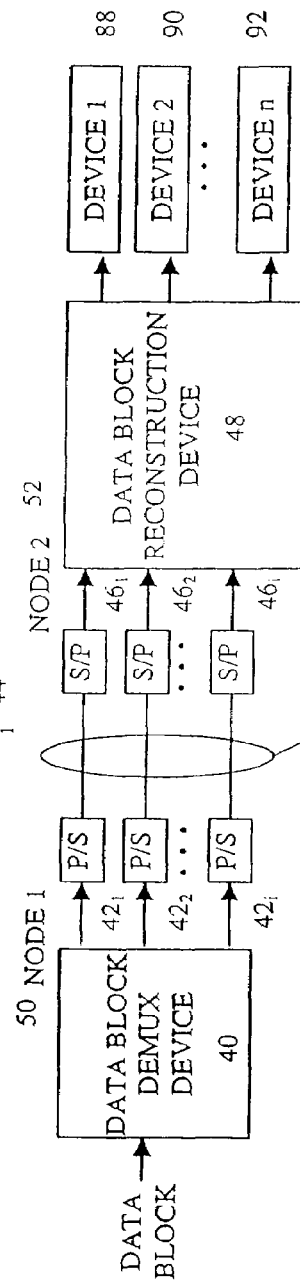
FIG. 12 is a block diagram of a destination controlling hybrid parallel/serial bus interface.

In another implementation as shown in FIG. 12, the start bits indicate a destination device. As illustrated in FIG. 13 for a two destination device/two line implementation, the combination of start bits relates to a destination device 88-92 for the transferred data block. A "01" represents device 1; a "10" represents device 2; and a "11" represents device 3. After receipt of the start bits of the data block reconstruction device 48, the reconstructed block is sent to the corresponding device 88-92. To increase the number of potential destination devices, additional start bits may be used. For n starting bits over each of i lines, up to $i^{n+1}-1$ devices are selected.

As illustrated in the table of FIG. 14, the start bits may be used to represent both function and destination device. FIG. 14 shows a three connection system having two devices, such as a RX and TX GC. Using the start bit for each line, three functions for two devices is shown. In this example, the start bit for line 1 represents the target device, a "0" for device 1 and a "1" for device 2. The bits for connections 2 and 3 represent the performed function. A "11" represents an absolute value function; a "10" represents a relative increase function; and a "01" represents a relative decrease. All three start bits as a zero, "000," is the normal non-data transfer state and "001" is not used. Additional bits may be used to add more functions or devices. For n starting bits over each of i lines, up to $i^{n+1}-1$ function/device combinations are possible.

Figure 15:
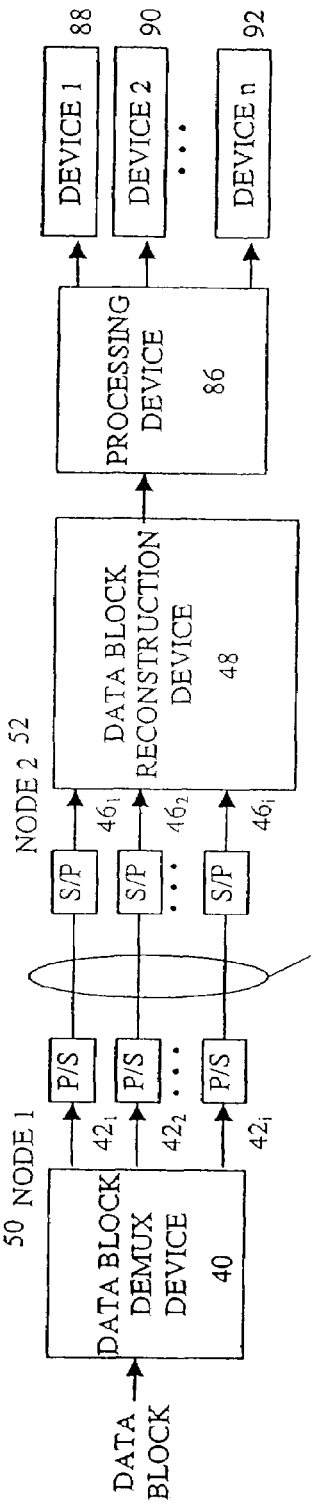
FIG. 15 is a block diagram of a destinations/functions controlling hybrid parallel/serial bus interface.

FIG. 15 is a block diagram for a system implementing the start bits indicating both function and destination device. The recovered nibbles are received by the data block reconstruction device 48. Based on the received start bits, the processing device 86 performs the indicated function and the processed block is sent to the indicated destination device 88-92.

As shown in the flow chart of FIG. 16, the start bits indicating the function/destination are added to each nibble, (94). The nibbles are sent via the i lines, (96). Using the start bits, the proper function is performed on the data block, the data block is sent to the appropriate destination or both, (98).

Figure 17:
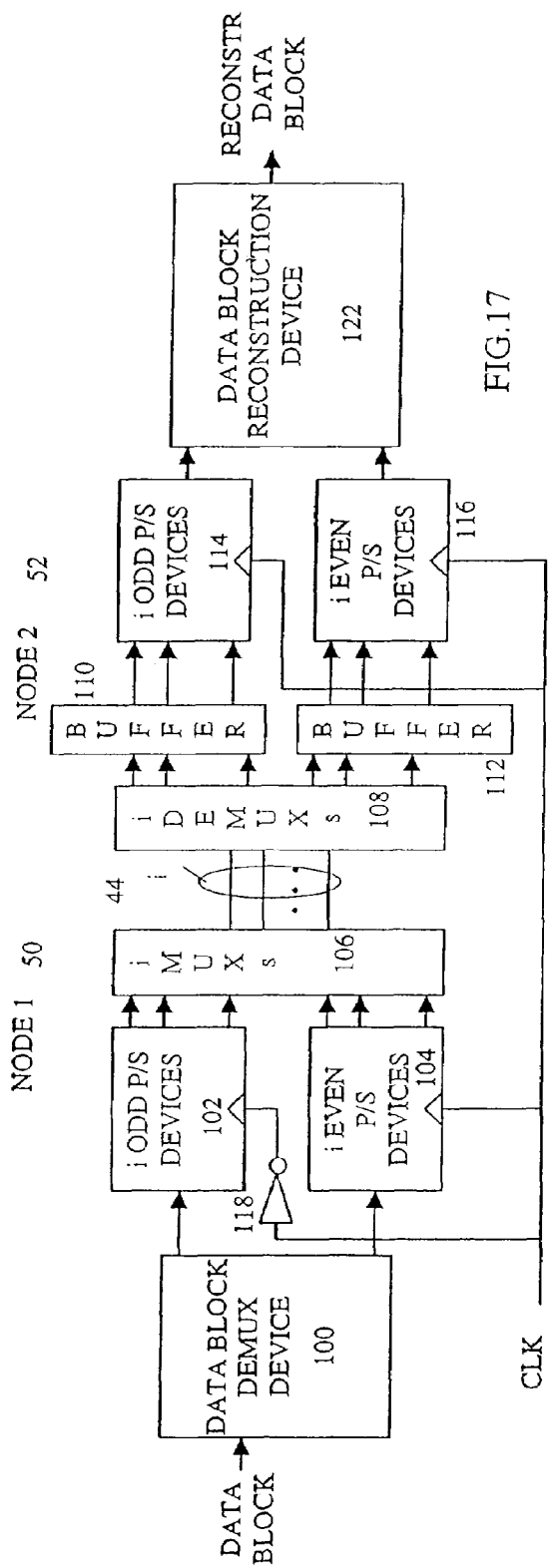
FIG. 17 is a block diagram for a positive and negative clock edge hybrid parallel/serial bus interface.

To increase the throughput in a synchronous system, both the positive (even) and negative (odd) edge of the clock are used to transfer block data. One implementation is shown in FIG. 17. The data block is received by a data block demultiplexing device 100 and demultiplexed into two (even and odd) sets of i nibbles. Each set of the i nibbles is sent to a respective set of i P/S devices 102, 104.

As shown in FIG. 17, an odd P/S device set 102, having i P/S devices, has its clock signal inverted by an invertor 118. As a result, the inverted clock signal is half a clock cycle delayed with respect to the system clock. A set of i MUXs 106 select at twice the clock rate between the even P/S device set 104 and the odd P/S device set 102. The resulting data transferred over each connection is at twice the clock rate. At the other end of each connection is a corresponding DEMUX 108. The DEMUXs 108 sequentially couple each line 44 to an even 112 and odd 110 buffer, at twice the clock rate. Each buffer 112, 110 receives a corresponding even and odd bit and holds that value for a full clock cycle. An even 116 and odd 114 set of S/P devices recover the even and odd nibbles. A data block reconstruction device 122 reconstructs the data block from the transferred nibbles.

FIG. 18 illustrates the data transfer over a line of a system using the positive and negative clock edge. Even data and odd data to be transferred over line 1 is shown. The hatching indicates the negative clock edge data in the combined signal and no hatching the even. As shown, the data transfer rate is increased by two.

Figure 19:
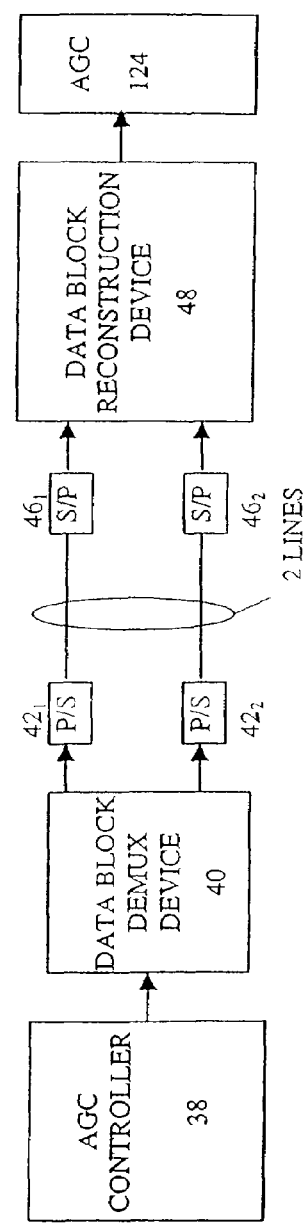
FIG. 19 is a block diagram of a 2-line GC/GC controller bus.

FIG. 19 is a preferred implementation of the hybrid parallel/serial interface used between a GC controller 38 and a GC 124. A data block, such as having 16 bits of GC control data (8 bits RX and 8 bits TX), is sent from the GC controller 38 to a data block demultiplexing device 40. The data block is demultiplexed into two nibbles, such as two eight bit nibbles. A start bit is added to each nibble, such as making 9 bits per nibble. The two nibbles are transferred over two lines using two P/S converters 42. The S/P converters 46 upon detecting the start bits convert the received nibbles to parallel format. The data block reconstruction device reconstructs the original 16 bits to control the gain of the GC 124. If a function is indicated by the start bits, such as in FIG. 11, the AGC 124 performs that function on the received block prior to adjusting the gain.

Figure 20:
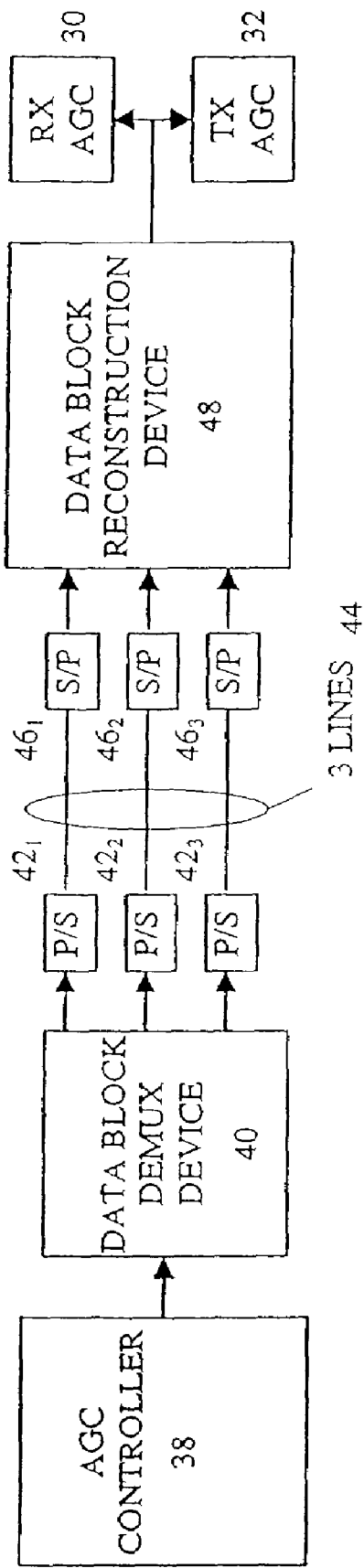
FIG. 20 is a block diagram of a 3-line GC/GC controller bus.

FIG. 20 is another preferred implementation for a hybrid parallel/serial converter, using three (3) lines, between a GC controller 38 and a RX GC 30 and TX GC 32. The GC controller 38 sends a data block to the GC 30, 32 with proper RX and TX gain values and start bits, such as per FIG. 14. If the start bits per FIG. 14 are used, Device 1 is the RX GC 30 and Device 2 is the TX GC 32. The data block demultiplexing device 40 demultiplexes the data block into three nibbles for transfer over the three lines. Using the three P/S converters 42 and three S/P converters 46, the nibbles are transferred serially over the lines and converted into the original nibbles. The data block reconstruction device 48 reconstructs the original data block and performs the function as indicated by the start bits, such as relative increase, relative decrease and absolute value. The resulting data is sent to either the RX or TX GC 30, 32 as indicated by the start bits.

What is claimed is:

1. Apparatus for use in a wireless unit for controlling signal levels of wireless messages sent and received by the wireless unit, comprising:
    a transmitter (TX) gain control device (TX GCD) and receiver (RX) gain control device (RX GCD) for respectively controlling a gain of signals respectively sent by and received by said devices;
    a GC controller for producing a data block having n data bits representing a gain value;
    i lines each configured to transfer portions of the data block from the GC controller to a given one of the TX GCD and RX GCD, where 1<i<n;
    a data block converting device for converting the data block into said data block portions, each data block portion having a start bit;
    each data block portion being applied to an associated one of said i lines;
    the data block portions from said i lines being combined to reconstruct the original data block;
    the data block being transferred to the given GCD based on the collective states of the start bits; and
    the given GCD receiving the data block and adjusting a gain of the signal handled by the given GCD using the gain value of the data block to thereby maintain the signal handled by the given GCD at a gain value determined by the GC controller.

2. The apparatus of claim 1 further comprising:
    i serial converter devices each associated with a first end of the i lines for transferring each block portion over its associated line in serial fashion; and
    i parallel converter devices each associated with a second end of the i lines for converting the block portion transferred in serial fashion to the original data block portion; and
    the data block portions being combined by a data block reconstruction device.

3. The apparatus of claim 1 wherein the TX GCD is configured to receive the signals to be transmitted and amplifies the signals to be transmitted based on the data block.

4. The apparatus of claim 1 wherein the RX GCD is configured to receive the signals sent to the wireless unit and amplifies the signals sent to the wireless unit based on the data block.

5. The apparatus of claim 1 wherein the states of the start bits indicate a mathematical function.

6. The apparatus of claim 5 wherein the mathematical functions indicated by the states of the start bits include one of a relative increase of a prior gain value, a relative decrease of a prior gain value and an absolute value to thereby avoid a need to provide a new gain value when a change in gain value is needed.

7. The apparatus of claim 2 wherein the i serial converters are parallel to serial converters.

8. The apparatus of claim 2 wherein the i parallel converters are serial to parallel converters.

9. The apparatus of claim 1 wherein the states of the start bits are either one of two binary states.

10. The apparatus of claim 1 wherein i is a number selected to enable the i start bits to simultaneously represent both the GCD to receive the data block and the function to be performed by the data of the data block.

11. The apparatus of claim 1 wherein i is at least 3.

12. A method for use by a wireless unit for controlling signal levels of wireless messages sent by a transmitter gain control device (TX GCD) and received by receiver gain control device (RX GCD) of the wireless unit, comprising:
    producing a data block of n data bits, states of the n data bits collectively representing a gain value;
    converting the data block into i data block portions where 1<i<n;
    providing each data block portion with a start bit;
    transferring each of the i data block portions and their associated start bits over an associated one of i lines;
    combining the data block portions transferred over said i lines to reconstruct the original data block;
    coupling the combined data block to one of said TX GCD and RX GCD based on the collective states of the start bits; and adjusting a gain of the signal handled by said one of said TX GCD and RX GCD based on the gain value of the combined data block.

13. The method of claim 12 further comprising:
applying each of the i data block portions to an associated one of the i lines in a serial fashion;
converting the data block portions applied to the i lines in serial fashion back to their original format; and
applying the reconstructed data block to the selected GCD to control a gain of the message signal based on a gain value represented by the collective states of the reconstructed data block.

14. The method of claim 12, the TX GCD receiving signals to be transmitted and amplifying the signals to be transmitted based on the reconstructed data block.

15. The method of claim 12, the RX GCD receiving signals sent to the wireless unit and amplifying the signals sent to the wireless unit based on the reconstructed data block.

16. The method of claim 12 wherein the states of the start bits indicate a mathematical function.

17. The method of claim 16 wherein the mathematical functions indicated by the states of the start bits include one of a relative increase of a prior gain value, a relative decrease of a prior gain value and an absolute value to thereby avoid a need to provide a new gain value when a change in gain value is needed.

18. The method of claim 13 wherein the data block portions are in a parallel format and the data block portions each undergo conversion to serial format employing parallel to serial converters.

19. The method of claim 13 wherein the serial format data applied to the i lines are converted to parallel format employing serial to parallel converters.

20. The method of claim 12 wherein the states of the start bits are either one of two binary states.

21. The method of claim 12, comprising selecting a number for wherein i to enable the i start bits to simultaneously represent both the GCD to receive the data block and the function to be performed by the data of the data block.

22. The method of claim 21 comprising selecting the number for i to be at least 3.

23. The method of claim 21, comprising selecting the number for i to enable the start bits to collectively represent at least 3 different functions and 2 different GCDs.

* * * * *

UNITED STATES PATENT AND TRADEMARK OFFICE
CERTIFICATE OF CORRECTION

PATENT NO.       : 7,475,273 B2
APPLICATION NO.  : 11/648938
DATED            : January 6, 2009
INVENTOR(S)      : Gredone et al.

It is certified that error appears in the above-identified patent and that said Letters Patent is hereby corrected as shown below:

TITLE PAGE

Item (56), OTHER PUBLICATIONS, page 2, right column, line 41, after "symlink/3606.pdf" insert --October 1983--.

Item (56), U.S. PATENT DOCUMENTS, page 2, left column, after the line beginning with "6,611,217" delete "6,729,003 B2 5/2004 Poturi et al.".

Item (56), FOREIGN PATENT DOCUMENTS, page 2, left column, after line beginning with "JP 11-187051", insert --JP 11-345190 12/1999--.

Signed and Sealed this

Twenty-third Day of June, 2009

JOHN DOLL
*Acting Director of the United States Patent and Trademark Office*